United States Patent
Oh

(10) Patent No.: US 7,919,988 B2
(45) Date of Patent: Apr. 5, 2011

(54) OUTPUT CIRCUIT AND DRIVING METHOD THEREOF

(75) Inventor: Seung-Min Oh, Gyeonggi-do (KR)

(73) Assignee: Hynix Semiconductor Inc., Gyeonngi-do (KR)

(*) Notice: Subject to any disclaimer, the term of this patent is extended or adjusted under 35 U.S.C. 154(b) by 0 days.

(21) Appl. No.: 12/493,843

(22) Filed: Jun. 29, 2009

(65) Prior Publication Data

US 2010/0039143 A1  Feb. 18, 2010

(30) Foreign Application Priority Data

Aug. 14, 2008  (KR) .................. 10-2008-0079862

(51) Int. Cl.
*H03K 19/094* (2006.01)
*H03K 19/0185* (2006.01)

(52) U.S. Cl. ............. 326/87; 326/29; 327/112; 327/170

(58) Field of Classification Search .................... 326/26, 326/27, 29, 83, 87; 327/112, 170

See application file for complete search history.

(56) References Cited

U.S. PATENT DOCUMENTS

| 6,653,873 | B1* | 11/2003 | Nguyen ................... 327/112 |
| 7,224,194 | B2 | 5/2007 | Lee |
| 7,236,012 | B2 | 6/2007 | Cho et al. |
| 7,279,933 | B2 | 10/2007 | Lee |
| 7,405,597 | B1* | 7/2008 | Pitkethly ................... 326/86 |
| 2006/0158224 | A1 | 7/2006 | Yan-Bin |
| 2009/0003086 | A1 | 1/2009 | Yun |
| 2009/0167413 | A1* | 7/2009 | Im et al. ................... 327/512 |
| 2009/0273363 | A1* | 11/2009 | Jeong et al. ................... 326/27 |

FOREIGN PATENT DOCUMENTS

KR  1020020078801 A  10/2002

OTHER PUBLICATIONS

Notice of Preliminary Rejection issued from Korean Intellectual Property Office on Aug. 31, 2009 with an English Translation.

* cited by examiner

*Primary Examiner* — Daniel D Chang
(74) *Attorney, Agent, or Firm* — IP & T Group LLP

(57) ABSTRACT

An output circuit includes a pre-driving unit configured to drive an input signal by using a different driving power according to an output operation mode and generate pull-up and pull-down signals corresponding to the resultant input signal and an output driving unit configured to output data in response to the pull-up and pull-down signals.

19 Claims, 3 Drawing Sheets

OUTPUT CIRCUIT AND DRIVING METHOD THEREOF

CROSS-REFERENCE TO RELATED APPLICATIONS

The present application claims priority of Korean patent application No. 10-2008-0079862, filed on Aug. 14, 2008, the disclosure of which is incorporated herein by reference in its entirety.

BACKGROUND OF THE INVENTION

The present invention relates to a semiconductor device, and more particularly, to an output circuit for adjusting a slew rate of data outputted from the semiconductor device, when an operation frequency of the semiconductor device is changed.

In general, a semiconductor device includes the output circuit to output a data, and the output circuit includes a pre-driver and an output driver. The pre-driver outputs a pull-up signal and a pull-down signal which correspond to the data outputted from memory cells. The output driver outputs the data to an output pad in response to the pull-up signal and the pull-down signal.

The data transferred from the output circuit to the output pad has the slew rate, which is a change amount of output voltage per unit time. The slew rate of data is changed according to a design of a semiconductor device such as the number of the output pads. For example, when the number of the output circuits satisfies the conditions for ×4, ×8 and ×16 operation modes of the semiconductor device, the slew rate of data is depending on operation modes, that is, operation modes have different slew rate of data. Particularly, when the semiconductor device is operated in ×16 operation mode, the slew rate of data is lower then that of ×4 or ×8 operation mode.

FIG. 1 is a timing diagram illustrating the operation of a conventional output circuit.

Referring to FIG. 1, the slew rate of data in ×4, ×8 and ×16 operation modes are different. Generally, the output circuit is designed based on the slew rate of data corresponding to ×16 operation mode. Thus, when the semiconductor device is operated in ×4 or ×8 operation mode, the semiconductor device may consume an operation current excessively.

SUMMARY OF THE INVENTION

Embodiments of the present invention are directed to provide an output circuit that can prevent the current consumption of the semiconductor device.

In accordance with an aspect of the present invention, there is provided an output circuit comprising a pre-driving unit configured to drive an input signal by using a different driving power according to an output operation mode and generate pull-up and pull-down signals corresponding to the resultant input signal and an output driving unit configured to output data in response to the pull-up and pull-down signals.

In accordance with another aspect of the present invention, there is provided a method for driving an output circuit comprising varying a driving power of an input signal according to an output operation mode, generating pull-up and pull-down signals corresponding to the resultant input signal and generating an output data corresponding to the pull-up and pull-down signals.

In accordance with another aspect of the present invention, there is provided an output circuit comprising a pre-driving unit configured to have a variable driving power selected in response to an output operation mode and generate pull-up and pull-down signals corresponding to an input signal by using the selected driving power and an output driving unit configured to generate output data in response to the pull-up and pull-down signals.

DESCRIPTION OF SPECIFIC EMBODIMENTS

Other objects and advantages of the present invention can be understood by the following description, and become apparent with reference to the embodiments of the invention.

Figure 1:
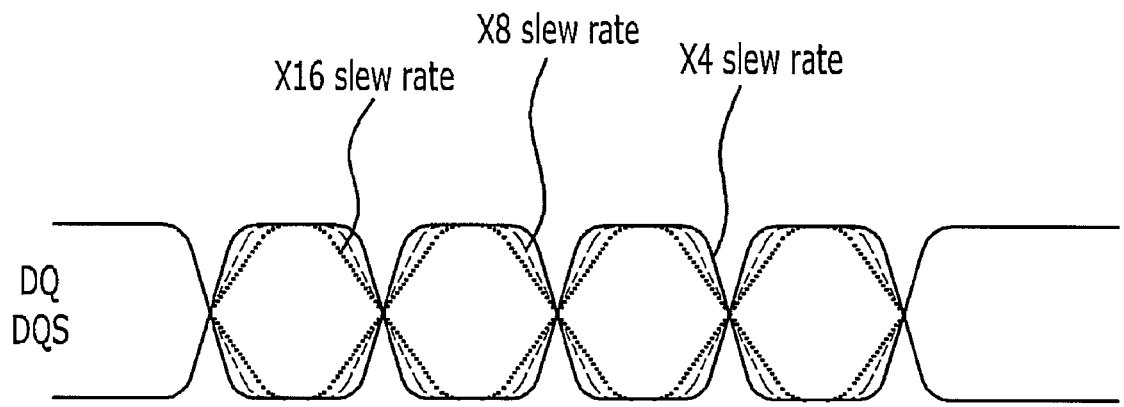
FIG. 1 is a timing diagram illustrating the operation of the conventional output circuit.
Figure 2:
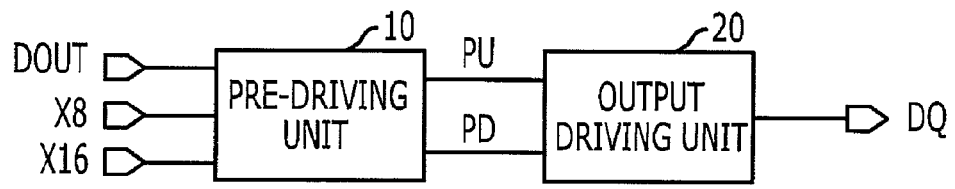
FIG. 2 is a block diagram illustrating an output circuit of a semiconductor device in accordance with an embodiment of the present invention.

FIG. 2 is a block diagram illustrating an output circuit of a semiconductor device in accordance with an embodiment of the present invention.

Referring to FIG. 2, the output circuit includes a pre-driving unit 10 and an output driving unit 20.

The pre-driving unit 10 is configured to receive an input data DOUT and output operation modes, and to vary a driving power according to an output operation mode, and generates pull-up and pull-down signals PU and PD. The output operation mode includes a first output operation mode being ×4 operation mode, a second output operation mode being ×8 operation mode and a third output operation mode being ×16 operation mode. Herein, ×4, ×8 and ×16 operation modes indicate the number of data which is simultaneously inputted or outputted once during a write operation or a read operation when the semiconductor device operates. For example, ×8 operation mode denotes that eight data are simultaneously inputted or outputted once during a write operation or a read operation. That is, in ×8 operation mode, the semiconductor device enables eight write drivers selected from a plurality of write drivers in the bank to perform the write operation or the read operation.

The output driving unit 20 is configured to generate output data DQ in response to the pull-up and pull-down signals PU and PD, and the output data DQ is transferred to an output pad.

Figure 3:
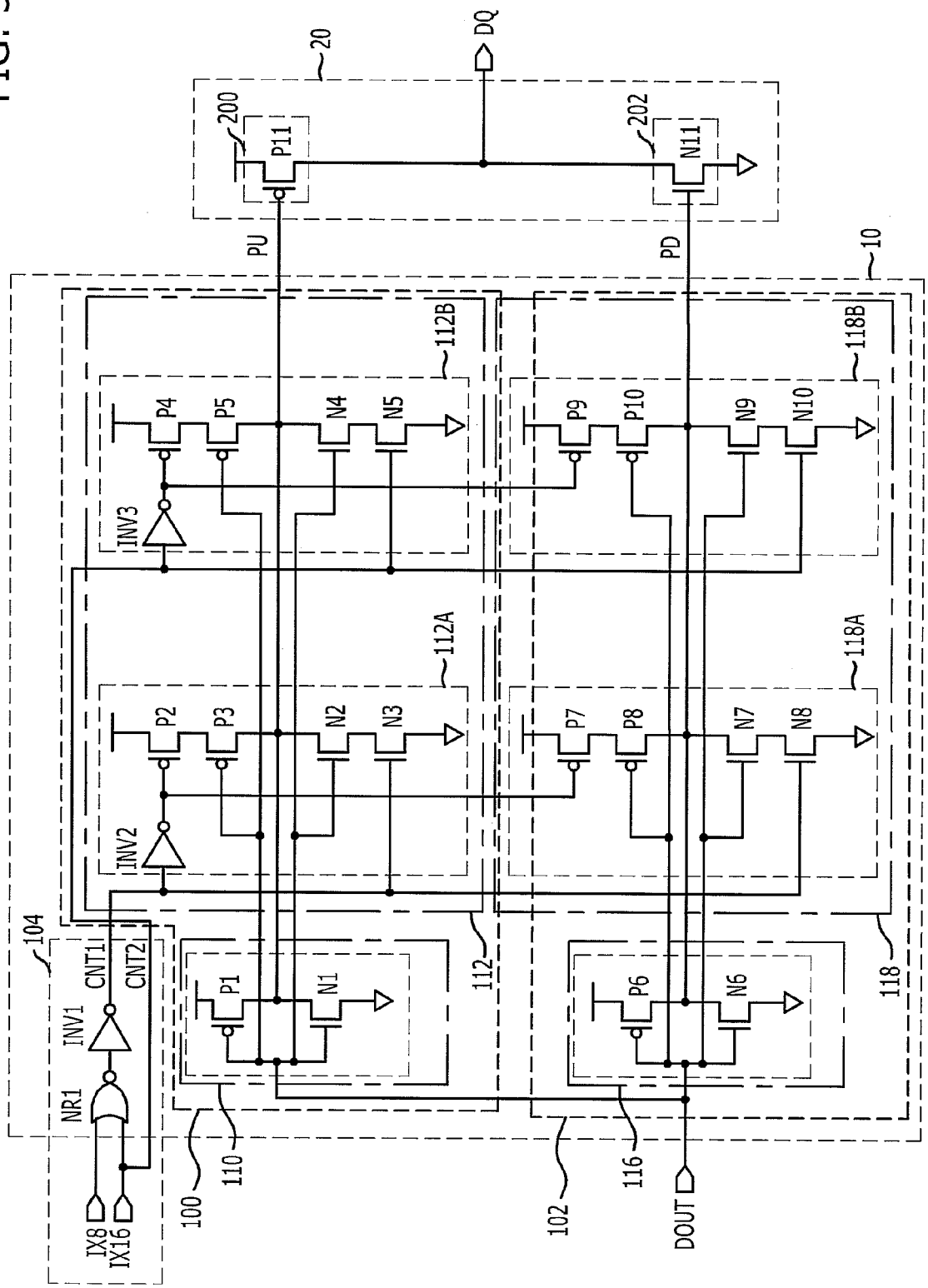
FIG. 3 is a circuit diagram illustrating the output circuit shown in FIG. 2.

FIG. 3 is a circuit diagram illustrating the output circuit shown in FIG. 2.

Referring to FIG. 3, the pre-driving unit 10 includes a pull-up pre-driving unit 100, a pull-down pre-driving unit 102 and a control unit 104.

The pull-up pre-driving unit 100 generates the pull-up signal PU corresponding to the input data DOUT. The pull-down pre-driving unit 102 generates the pull-down signal PD corresponding to the input data DOUT. The control unit 104 enables the pull-up and pull-down pre-driving units 100 and 102 based on the output operation mode.

The pull-up pre-driving unit 100 includes a first pull-up pre-driving block 110 and a second pull-up pre-driving block 112. The first pull-up pre-driving block 110 includes a first PMOS transistor P1 and a first NMOS transistor N1, and generates the pull-up signal PU corresponding to the input data DOUT. A gate of the first PMOS transistor P1 and a gate of the first NMOS transistor N1 receive the input data DOUT.

The second pull-up pre-driving block 112 includes first and second pull-up pre-drivers 112A and 112B, and generates the pull-up signals PU corresponding to the input data DOUT. The first and second pull-up pre-drivers 112A and 112B are selectively enabled in response to control signals CNT1 and CNT2 outputted from the control unit 104.

The first pull-up pre-driver 112A includes a second inverter INV2, second and third PMOS transistors P2 and P3 and second and third NMOS transistors N2 and N3.

The second inverter INV2 inverts the first control signal CNT1 and outputs an inverted first control signal. A gate of the second PMOS transistor P2 receives the inverted first control signal. A gate of a third PMOS transistor P3 receives the input data DOUT. A gate of the second NMOS transistor N3 receives the input data DOUT. A gate of the third NMOS transistor N3 receives the first control signal CNT1.

The second pull-up pre-driver 112B includes a third inverter INV3, fourth and fifth PMOS transistors P4 and P5 and fourth and fifth NMOS transistors N4 and N5.

The third inverter INV3 inverts the second control signal CNT2 and outputs an inverted second control signal. A gate of the fourth PMOS transistor P4 receives the inverted second control signal. A gate of the fifth PMOS transistor P5 receives the input data DOUT. A gate of the fourth NMOS transistor N4 receives the input data DOUT. A gate of the fifth NMOS transistor N5 receives the second control signal CNT2.

The pull-down pre-driving unit 102 includes a first pull-down pre-driving block 116 and a second pull-down pre-driving block 118. The first pull-down pre-driving block 116 includes a sixth PMOS transistor P6 and a sixth NMOS transistor N6, and generates the pull-down signal PD corresponding to the input data DOUT. A gate of the sixth PMOS transistor P6 receives the input data DOUT, and a gate of the sixth NMOS transistor N6 receives the input data DOUT.

The second pull-down pre-driving block 118 includes first and second pull-down pre-drivers 118A and 118B, and generates the pull-up signal PD corresponding to the input data DOUT. The first and second pull-down pre-drivers 118A and 118B are selectively enabled in response to a control signals CNT1 and CNT2 outputted from the control unit 104.

The first pull-down pre-driver 118A receives the input data DOUT, outputs the pull-down signal PD, and is enabled by the first control signal CNT1. The first pull-down pre-driver 118A includes seventh and eighth PMOS transistors P7 and P8 and seventh and eighth NMOS transistors N7 and N8.

A gate of the seventh PMOS transistor P7 receives the inverted first control signal from the second inverter INV2 of a first pull-up pre-driver 112A. A gate of the eighth NMOS transistor N8 receives the first control signal CNT1.

The second pull-down pre-driver 118B includes ninth and tenth PMOS transistors P9 and P10 and ninth and tenth NMOS transistors N9 and N10. The second pull-down pre-driver 118B receives the input data DOUT, outputs the pull-down signal PD, and is enabled by the second control signal CNT2.

A gate of the ninth PMOS transistor P9 receives the inverted second control signal from the third inverter INV3 of the second pull-up pre-driver 112B. A gate of the tenth PMOS transistor P10 receives the input data DOUT. A gate of the ninth NMOS transistor N9 receives the input data DOUT. A gate of the tenth NMOS transistor N10 receives the second control signal CNT2.

The control unit 104 generates the first control signal CNT1 corresponding to the second and third output operation modes, and second control signal CNT2 corresponding to the third output operation mode. The control unit 104 includes a NOR gate NR1 for receiving the second and third output operation mode signals ×8 and ×16, and a first inverter INV1 for receiving an output of the NOR gate NR1, and for outputting the first control signal CNT1.

The output driving unit 20 includes a first driving unit 200 for generating the output data DQ in response to the pull-up signal PU, and a second driving unit 202 for generating the output data DQ in response to the pull-down signal PD.

The first driving unit 200 includes an eleventh PMOS transistor P11, and the second driving unit 202 includes an eleventh NMOS transistor N11. A gate of the eleventh PMOS transistor P11 receives the pull-up signal PU, and a gate of the eleventh NMOS transistor N11 receives the pull-down signal PD.

The operation of output circuit will be described hereinafter in detail.

It is assumed that the semiconductor device operates in ×4 operation mode, the control unit 104 generates the first control signal CNT1 inactivated, and the second control signal CNT2 inactivated. That is, the first and second control signals CNT1 and CNT2 have a logic 'low' level. Thus, the first and second pull-up pre-drivers 112A and 112B, and the first and second pull-down pre-drivers 118A and 118B are disabled in response to the first and second control signals CNT1 and CNT2 inactivated. Therefore, the first pull-up pre-driving block 110 and the first pull-down pre-driving block 116 are only enabled, and output the pull-up and pull-down signals PU and PD. That is, the pull-up and pull-down signals PU and PD are generated by using the driving power of the first pull-up pre-driving block 110 and the first pull-down pre-driving block 116. Thus, the output driving unit 20 receives the pull-up and pull-down signals PU and PD, and generates the output data DQ. The output data DQ is transferred to an output pad.

It is assumed that the semiconductor device operates in ×8 operation mode, the control unit 104 generates the first control signal CNT1 activated, and the second control signal CNT2 inactivated. That is, the first control signal CNT1 has a logic 'high' level, and the second control signal CNT 2 has a logic 'low' level. Thus, the first pull-up pre-driver 112A and the first pull-down pre-driver 118A are enabled in response to the first control signal CNT1 activated, and the second pull-up pre-driver 112B and the second pull-down pre-driver 118B are disabled in response to the second control signal CNT2 inactivated. Accordingly, the first pull-up pre-driving block 110, the first pull-up pre-driver 112A, the first pull-down pre-driving block 116, and the first pull-down pre-driver 118A are enabled, and output the pull-up and pull-down signals PU and PD. That is, the pull-up and pull-down signals PU and PD are generated by using driving power of the first pull-up pre-driving block 110, the first pull-up pre-driver 112A, the first pull-down pre-driving block 116, and the first pull-down pre-driver 118A. Thus, the output driving unit 20 receives the pull-up and pull-down signals PU and PD, and generates the output data DQ. The output data DQ is transferred to an output pad.

It is assumed that the semiconductor device operates in ×16 operation mode, the control unit 104 generates the first control signal CNT1 activated, and the second control signal CNT2 activated. That is, the first control signal CNT1 has a logic 'high' level, and the second control signal CNT 2 has a logic 'high' level. Thus, the first pull-up pre-driver 112A and the first pull-down pre-driver 118A are enabled by the first control signal CNT1 activated, and the second pull-up pre-driver 112B and the second pull-down pre-driver 118B are enabled in response to the second control signal CNT2 activated. Accordingly, the first pull-up pre-driving block 110, the first pull-up pre-driver 112A, the second pull-up pre-driver 112B, the first pull-down pre-driving block 116, the first pull-down pre-driver 118A, and second pull-down pre-driver 118B are enabled, and output the pull-up and pull-down signals PU and PD. That is, the pull-up and pull-down signals PU and PD are generated by using the driving power of the first pull-up pre-driving block 110, the first pull-up pre-driver 112A, the second pull-up pre-driver 112B, the first pull-down pre-driving block 116, the first pull-down pre-driver 118A, and the second pull-down pre-driver 118B. Thus, the output driving unit 20 receives the pull-up and pull-down signals PU and PD, and generates the output data DQ. The output data DQ is transferred to an output pad.

Figure 4:
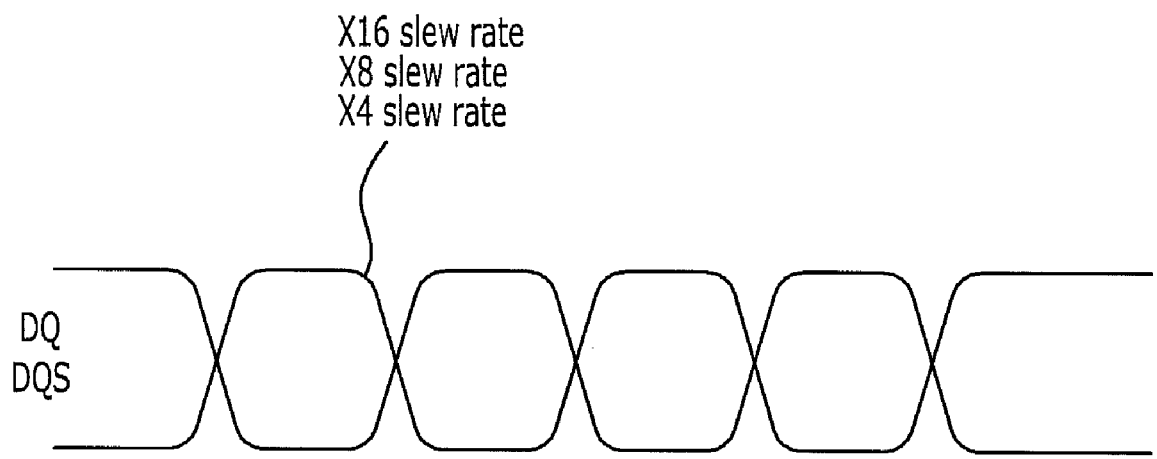
FIG. 4 is a timing diagram illustrating the operation of the output circuit shown in FIG. 2.

FIG. 4 is a timing diagram illustrating the operation of the output circuit shown in FIG. 2.

Referring to FIG. 4, when the number of the output circuits satisfies the conditions for ×4, ×8 and ×16 operation modes of the semiconductor device, the slew rates of data is same during all operation modes. Thus, even though the output circuit is designed according to the slew rate of data corresponding to ×16 operation mode, when the semiconductor device is operated in ×4 or ×8 operation mode, the semiconductor device does not consume an operation current excessively.

While the present invention has been described with respect to the specific embodiments, it will be apparent to those skilled in the art that various changes and modifications may be made without departing from the spirit and scope of the invention as defined in the following claims.

What is claimed is:

1. An output circuit for a semiconductor device, comprising:
   a pre-driving unit configured to drive pull-up and pull-down signals corresponding to an input data by selecting a variable driving power according to an output operation mode, wherein the output operation mode indicates the number of data which are simultaneously inputted or outputted at one time during a write operation or a read operation of the semiconductor device; and
   an output driving unit configured to output data in response to the pull-up and pull-down signals.

2. The output circuit of claim 1, wherein the output operation mode comprises a first output operation mode being ×4 operation mode, a second output operation mode being ×8 operation mode and a third output operation mode being ×16 operation mode.

3. The output circuit of claim 2, wherein the pre-driving unit comprises:
   a pull-up pre-driving unit configured to have a variable pull-up driving power selected in response to a control signal and generate the pull-up signal corresponding to the input data by using the selected pull-up driving power;
   a pull-down pre-driving unit configured to have a variable pull-down driving power selected in response to the control signal and generate the pull-down signal corresponding to the input data by using the selected pull-down driving power; and
   a control unit configured to generate the control signal based on the output operation mode.

4. The output circuit of claim 3, wherein the control signal includes a first control signal corresponding to the second and third output operation modes, and a second control signal corresponding to the third output operation mode.

5. The output circuit of claim 4, wherein the pull-up pre-driving unit comprises:
   a first pull-up pre-driving block configured to generate the pull-up signal corresponding to the input data; and
   a second pull-up pre-driving block configured to be selectively enabled in response to the first and second control signals, and to generate the pull-up signal corresponding to the input data.

6. The output circuit of claim 5, wherein the first pull-up pre-driving block is configured to receive the input data and generate the pull-up signal.

7. The output circuit of claim 5, wherein the second pull-up pre-driving block is configured to receive the input data and generate the pull-up signal.

8. The output circuit of claim 5, wherein the second pull-up pre-driving block comprises:
   a first pull-up pre-driver configured to be enabled in response to the first control signal, receive the input data, and generate the pull-up signal; and
   a second pull-up pre-driver configured to be enabled in response to the second control signal, receive the input data, and generate the pull-up signal.

9. The output circuit of claim 8, wherein the control unit comprises:
   a NOR gate configured to perform a NOR operation on the first and second control signals; and
   an inverter configured to invert an output of the NOR gate, wherein the output of the inverter is coupled to the first pull-up pre-driver of the second pull-up pre-driving block and the second control signal is coupled to the second pull-up pre-driver of the second pull-up pre-driving block.

10. The output circuit of claim 4, wherein the pull-down pre-driving unit comprises:
    a first pull-down pre-driving block configured to generate the pull-down signal corresponding to the input data; and
    a second pull-down pre-driving block configured to be enabled selectively in response to the first and second control signals, and generate the pull-down signal corresponding to the input data.

11. The output circuit of claim 10, wherein the first pull-down pre-driving block is configured to receive the input data and generate the pull-down signal.

12. The output circuit of claim 10, wherein the second pull-down pre-driving block is configured to receive the input data and generate the pull-down signal.

13. The output circuit of claim 10, wherein the second pull-down pre-driving block comprises:
    a first pull-down pre-driver configured to be enabled in response to the first control signal, receive the input data, and generate the pull-down signal;
    a second pull-down pre-driver configured to be enabled in response to the second control signal, receive the input data, and output the pull-down signal.

14. The output circuit of claim 1, wherein the output driving unit comprises:
    a first driving unit configured to generate the output data in response to the pull-up signal; and
    a second driving unit configured to generate the output data in response to the pull-down signal.

15. A method for driving an output circuit in a semiconductor device, comprising:
    selecting a varying driving power of pull-up and pull-down signals according to an output operation mode, wherein the output operation mode indicates the number of data which are simultaneously inputted or outputted at one time during a write operation or a read operation of the semiconductor device;

generating the pull-up and pull-down signals corresponding to an input data by using the selected driving power; and generating an output data corresponding to the pull-up and pull-down signals.

16. The method of claim 15, wherein the output operation mode comprises a first output operation mode being ×4 operation mode, a second output operation mode being ×8 operation mode and a third output operation mode being ×16 operation mode.

17. An output circuit for a semiconductor device, comprising:
  a pre-driving unit configured to have a variable driving power selected in response to an output operation mode and generate pull-up and pull-down signals corresponding to an input data by using the selected driving power, wherein the output operation mode indicates the number of data which is simultaneously inputted or outputted at one time during a write operation or a read operation of the semiconductor device; and
  an output driving unit configured to generate an output signal in response to the pull-up and pull-down signals.

18. The output circuit of claim 17, wherein the pre-driving unit comprises:
  a pull-up pre-driving unit configured to have a variable pull-up driving power selected in response to a control signal and generate the pull-up signal corresponding to the input data by using the selected pull-up driving power;
  a pull-down pre-driving unit configured to have a variable pull-down driving power selected in response to the control signal and generate the pull-down signal corresponding to the input data by using the selected pull-down driving power; and
  a control unit configured to generate the control signal based on the output operation mode.

19. The output circuit of claim 18, wherein the pull-up pre-driving unit comprises:
  a first pull-up pre-driving block coupled to receive the input data and drive the pull-up signal in response to the input data; and
  a second pull-up pre-driving block coupled to receive the input data and drive the pull-up signal in response to the input data and the control signal, wherein the control signal includes a first control signal and a second control signal and the control unit comprises:
    a NOR gate configured to perform a NOR operation on the first and second control signals; and
    an inverter configured to invert an output of the NOR gate, wherein the output of the inverter is coupled to a first pull-up pre-driver of the second pull-up pre-driving block and the second control signal is coupled to a second pull-up pre-driver of the second pull-up pre-driving block.

* * * * *